United States Patent [19]

Lazarov et al.

[11] Patent Number: 5,776,556
[45] Date of Patent: Jul. 7, 1998

[54] METHOD FOR DEPOSITING THIN LAYERS OF A MATERIAL CONSISTING OF CHEMICAL COMPOUNDS COMPRISING A METAL FROM GROUP IV OF THE PERIODIC SYSTEM, NITROGEN AND OXYGEN ONTO HEATABLE SUBSTRATES

[76] Inventors: Miladin P. Lazarov, 1075 Calle Ciruelo, Thousand Oaks, Calif. 91360; Isabella V. Mayer, Schelling Str 75, D-80799 Munich, Germany

[21] Appl. No.: 681,762

[22] Filed: Jul. 29, 1996

Related U.S. Application Data

[62] Division of Ser. No. 276,026, Jul. 15, 1994, Pat. No. 5,670,248.

[30] Foreign Application Priority Data

Dec. 23, 1993 [DE] Germany .......................... 43 44 258.7

[51] Int. Cl.$^6$ .............................. B05D 3/06; C23C 14/24
[52] U.S. Cl. .................. 427/567; 427/126.3; 427/255.3; 427/255.2; 427/255.1
[58] Field of Search .......................... 427/126.1, 566, 427/126.3, 567, 255.3, 255.2, 255.1

[56] References Cited

U.S. PATENT DOCUMENTS

| | | | |
|---|---|---|---|
| 4,098,956 | 7/1978 | Blickensderfer et al. | 428/627 |
| 4,861,669 | 8/1989 | Gillery | 428/434 |
| 5,336,565 | 8/1994 | Muromachi et al. | 428/432 |

*Primary Examiner*—Roy V. King
*Attorney, Agent, or Firm*—Frohwitter

[57] ABSTRACT

The invention concerns process for producing thin layers of a material containing chemical compounds between a metal from group IV A of the periodic system, nitrogen and oxygen. The optical and electrical properties of this material can be set within wide limits by means of small voids, without the need to alter the chemical composition. The material is suitable in particular for use as a selective radiation converter in the solar energy and power industry. Aside from other processes for its manufacture, it can be produced as a thin coating deposited on a substrate by means of reactive evaporation.

15 Claims, 5 Drawing Sheets

METHOD FOR DEPOSITING THIN LAYERS OF A MATERIAL CONSISTING OF CHEMICAL COMPOUNDS COMPRISING A METAL FROM GROUP IV OF THE PERIODIC SYSTEM, NITROGEN AND OXYGEN ONTO HEATABLE SUBSTRATES

CONTINUATION STATEMENT

The present application is a division of patent application Ser. No. 08/276,026, filed 15 Jul. 1994, now U.S. Pat. No. 5,670,248.

BACKGROUND OF THE INVENTION

The invention concerns a material composed of a metal from group IV of the periodic chart, nitrogen and oxygen having the formula $MN_xO_y$ wherein M is a metal from group IV, $x$ and $y$ range from about 0.1 to 1.7 and wherein 2 to 45% of the volume is comprised of voids ranging from $(0.5 \text{ nm})^3$ to about $(100 \text{ nm})^3$ in size. This material can be used to convert radiation energy to heat energy, serve as an antireflective layer, radiation emitter or antimicrobial agent. It is preferably manufactured by a vacuum deposition technique. Further, the invention relates generally to chemical compositions containing metals from group IV of the periodic chart, nitrogen, and oxygen and having voids distributed within such composition.

Compounds of titanium with nitrogen and oxygen cover a broad range of the known properties of substances and are therefore widely used in industry. Titanium dioxide, for example, is a principal component of paints for walls, but is also used in solar cells. The compound TiN is known as an electrically conductive ceramic and distinguished by high resistance and hardness. Tools are hardened with it, and this compound is utilized in the semiconductor industry as a diffusion barrier between silicon and aluminum. Mixtures of TiN and titanium oxide phases have not been thoroughly studied. For practical applications, materials combining the two properties, dielectric and metallic, would be very attractive.

The authors of Offenlegungsschrift DE-OS 3,522,427 A1 disclose a material comprising titanium and nitrogen whose electrical proper-ties are adapted to various applications by the admixture of oxygen. This leads to changes in the chemical composition and has a negative influence upon other physical and chemical properties, for example, adhesiveness, resistance to corrosion, resistance to temperature or hardness. Particularly detrimental thereby is the fact that this material tends to oxidize when it is exposed to oxygen. But because the desired properties are determined by the portion of oxygen, they change with time, which stands in the way of practical application.

In the US patent specification of Blickensderfer, et al., U.S. Pat. No. 4,098,956, a selective absorber is disclosed, which is coated with $TiN_xO_y$. The patentees report on the presence of oxygen and carbon in the coating. Voids or empty spaces, as a decisive feature, are not mentioned and known to the patentees as properties essential to the application. The subject matter of U.S. Pat. No. 4,098,956 has the disadvantage that the optical properties can be adapted to various requirements only by variation of the chemical composition. These necessary changes in the chemical composition cause other necessary properties, for example, adhesiveness, to be lost. The authors report on these disadvantages in another publication: Blickensderfer, R., D. K. Deardorff, R. L. Lincoln. 1977. Spectral reflectance of $TiN_x$ and $ZrN_x$ films as selective solar absorbers. *Solar Energy* 19:429–432., where problems with degradation in the case of such materials are described.

Aside from numerous studies on TiN (see, for example, DE 3,210,420 or DE 3,300,694) and titanium dioxide (see, for example, DE 3,116,677), titanium oxynitride ($TiN_xO_y$) was studied by Vogelzang, et al. (Vogelzang, E., J. Sjollema, H. J. Boer, J. Th. M. DeHosson. 1987. Optical absorption in $TiN_xO_y$ compounds. *J. Appl. Phys.* 61(9):4606–4611). In the cited study, the complex value dielectric constant $e(\lambda)$, as a function of wavelength $\lambda$ in the 0.4 to 30 µm range, was published in addition to other measurement values. If these published values and the Fresnel theory are used to calculate the degrees of reflection and transmission, the calculations will not agree with the results published by the authors in the same work. It must therefore be assumed that an error has crept into the determination of $e(\lambda)$. Thus, the explanation of the optical and dielectric behavior in this study is likewise inadequate, a practical application being, for that reason, not possible.

Published in Offenlegungsschrift 3,640,086 A1 are compounds of titanium, nitrogen and carbon. It is required as a characteristic that the portion of oxygen be higher than that of nitrogen or carbon. But in this case, too, no attention is given to the void percentage.

The preparation of a material containing titanium, nitrogen and carbon is disclosed in DE 3,637,810 A1. It is known that dense layers develop due to the ion-plating used. It is therefore taken as a point of departure that voids are lacking in these layers.

Materials with voids (or empty spaces) are described in the literature rather frequently, for example, for thin layers consisting of TiN (see, for Example, Martin, P. J., R. P. Netterfield and W. G. Sainty. 1982. Optical properties of $TiN_x$ produced by reactive evaporation and reactive ion-beam sputtering. *Vacuum* 32:359–362, or DE 4,207,368 A1), especially Schellinger, et al. on $TiN_xO_y$ (Schellinger, H., M. Lazarov, H. Klank, R. Sizmann. 1993. Thermal and chemical metallic-dielectric transitions of $TiN_xO_y$-Cu absorber tandems. *Proc. SPIE* 2017, *Optical Materials Technology for Energy Efficiency and Solar Energy Conversion XII*). All authors thus far report on the mere existence of voids. The quantification of the voids has not yet been accomplished.

Patent specification DT 2,216,432 C3 contains a report of titanium dioxide with open porosity. The voids (pores) reported there have very large volumes.

Optical and electrical properties of materials can be classified into dielectric and metallic, the use of the materials being in this case decisive. In the case of many applications, however, mixtures of the two properties are needed. In an absorber-reflector tandem (see, for example, DE 2,639,388 C2 or DE 2,734,544 C2) neither a pure metal nor a dielectric is able to deliver a selective absorption for solar rays. Semiconductors, with and without doping, meet such demands in part and are utilized in many applications. If one has in mind a selective absorber, the fixed band gaps and the relatively flat absorption curve, typical for a semiconductor, are antithetical to highly selective properties.

SUMMARY OF THE INVENTION

The purpose of the present invention is therefore to avoid the described disadvantages and produce a material with improved properties. A further objective of the present invention is to make available a process for the production of the invented material. A further goal consists in the development of a device utilizable in this process.

The problem is solved by the subject material which is composed of a metal from group IV B of the CAS periodic chart, nitrogen and oxygen having the formula $MN_xO_y$ wherein M is a metal from group IV B, $_x$ and $_y$ range from about 0.1 to 1.7 and wherein 2 to 45% of the volume is comprised of voids ranging from $(0.5 \text{ nm})^3$ to about $(100 \text{ nm})^3$ in size and wherein the material is manufactured by a vacuum deposition technique.

The material according to the present invention comprises compounds of one or more metals from group IV B of the periodic system, nitrogen and oxygen, in which case from 2 to 45%, preferably from 5 to 40%, very preferably from 10 to 28% of the volume are formed by voids (empty spaces) whose size lies in the range from $(0.5 \text{ nm})^3$ to $(100 \text{ nm})^3$. The remaining volume of the material (98–55%, preferably 95–60%) exhibits a composition of the group IVA metal of the periodic system to nitrogen to oxygen of 1:(0.1 to 1.7):(0.1 to 1.7), preferably 1:(0.25 to 1.5):(0.25 to 1.5). The material has the formula $MN_xO_y$, where "M" indicates the metal of group IV B of the periodic system and $_x$ or $_y$ the values 0.1 to 1.7. The above ratios refer to the particle number or molar ratios. Regarding the size of the voids, it is preferred that the latter occur in the lower range, i. e. preferably not larger than $(15 \text{ nm})^3$. The "remaining volume" of the material comprises preferably one or more of the chemical compounds selected from $MN_x$ (x=0.7 to 1.2), Magnelli phases of the M-O system $(M_nO_{2n-1})$, $MO_2$, $M_2N$ (with M=metal from group IV B of the periodic system) as well as approximately 0–30%, preferably 0.5–5%, of carbon compounds of a metal of group IV A of the periodic system. The range of important application options is expanded by these preferably supplementarily contained compounds. Small amounts of titanium carbides as impurities are not disturbing in the case of many applications, but permit cheaper production. The possibility that the chemical phases present in the invented material can be available, preferably in crystalline or amorphous form, permits various application fields to be covered, for example, in crystalline form as a diffusion barrier in the semiconductor industry or in amorphous form as a decorative layer. The metal from group IV B of the periodic system is titanium, zirconium or hafnium or a mixture of two or three metals, preferably titanium.

The invented material can be further described by the fact that, if p is the average of the mass densities of the individual chemical compounds of which the material is composed and $p_m$ is the mass densities of the material including voids, the size $$\frac{\bar{p} - p_m}{\bar{p}}$$

will lie in the range from 0.02 to 0.5.

Furthermore it is preferred that the invented material exhibit voids with a fractal size distribution. By means of the present specification of the void type, the invented material is clearly delimited by materials whose reduced mass density is attributable to altered lattice constants and high density of missing atoms in the lattice. The defined void portion and void distribution permit the invented material to be utilized as a standard in neutron scatter studies.

Further characteristic of the invented material is that the real part of the refractive index for the X-ray wavelength of 0.0709 nm will preferably lie in the range from 0.9999984 to 0.9999973. The mass density of the invented material lies preferably in the range from 3.7 to 4.5 g/cm³, preferably from 3.8 to 4.2 g/cm³. By virtue of these of the properties, the invented material is also suitable for use as a standard in thin film density determinations.

A further property of the invented material is that the complex-valued refractive index for wavelengths in the 0.5 to 4.5 μm range points to neither typical metallic behavior nor to typical dielectric behavior. This makes the material very suitable as a radiation energy converter. Utilization for the conversion of radiation energy into heat demands optical properties in the infrared which are neither of a metallic nor dielectric nature. Metallic properties can be described by a Drude theory for the free movement of electrons in metal, while dielectric properties are distinguished by the imaginary part of the refractive index. In the case of the invented material, electron-loss spectroscopic (EELS) measurements show a peak which can be interpreted as a plasma wavelength $\lambda_p$ in the sense of the Drude theory for the free movement of electrons in metal, $\lambda_p$ lying in the range from 1.1 to 0.1 μm. This plasma wavelength does not however correlate with typical metallic behavior (describable by the Drude theory for the free movement of electrons in metal) of the optical constants.

The invented material is preferably available in the form of a powder or glass. This permits an application of the material in the volumetric absorber field.

If use is made of titanium, zirconium or hafnium compounds, this expands the application range of the material to fields requiring high temperature stability. Zirconium or hafnium compounds show higher thermal stability than titanium compounds, being furthermore resistant to diffusion processes.

The invented material can preferably be available as a thin layer whose coating thickness is in the 3 nm to 3 mm range, preferably the 10 nm to 2 mm range, and very preferably the range between 30 and 71 nm.

The thin layer thereby preferably exhibits a columnar micro-structure. This permits applications where the layer is to be porous or rough. This thin layer consisting of the invented material has a specific resistance in the range from 30 to 30.000 μΩ.cm, preferably from 100 to 6.000 μΩ.cm, very preferably from 2.000 to 3.000 μΩ.cm. This property anticipates applications in the semiconductor industry in which, whenever a different specific resistance is needed, it should be easily possible to alter the production process to meet these requirements in order to keep costs down. The specific resistance can be adjusted by the choice of the void portion without difficulty. Taking the specific resistance of the material without voids as a point of departure, this property increases as voids are added. For example, in the case of $TiN_{0.98}O_{0.2}$, the specific resistance can lie at 70 μΩ×cm, if the void share is 3% and increases to values in the 650 μΩ range, if the void share is at 40%.

If still other supplementary compounds, like those listed in patent claims 2 and 3, are present in the material, there is no need for them to occur in the same ratio at each level of the thin layer. This permits use as a gradient coating, for example, in the case of selective coatings it is desired to alter the optical properties with the layer thickness. This can be easily accomplished here by variation of the chemical compounds or by changing the share of voids. By preference, the portion of voids changes with the depth of the thin layer. It is preferred that the uppermost 0 to 50% of the thin layer, measured at the total thickness, consist of $TiO_2$, $ZrO_2$ or $HfO_2$.

The material is thereby suitable for applications in which the uppermost layers are to have electrical properties, for example, in the case of insulators.

The invented material can be applied preferably as a thin coating to a metallic substrate consisting of molybdenum, silver, gold, copper, aluminum, tungsten, nickel, chromium, zirconium, titanium, hafnium, tantalum, niobium, vanadium, iron and their alloys. The metallic substrate can be applied in turn to any other solid carrier. The metallic substrate is preferably one produced by a rolling or pouring process and contains impurities. The invented material, formed as a thin coating, is preferably applied to a rough substrate, whose roughness is characterized by a statistical distribution of deviations from an average level, the standard deviation of this distribution lying in the 0–1,500 nm range, preferably 40–120 nm. The roughness makes possible better absorption in the case of short wavelengths and therefore permits its use as an absorber-reflector tandem.

The material per the invention, formed as a thin layer, can be coated by an additional thin layer consisting of one or more oxides, preferably $SiO_2$, $ZrO_2$, $HfO_2$, $Al_2O_3$, $Y_2O_3$. With this additional layer, which is preferably thinner than 60 nm, the material can be passivated, prolonging its useful life. A layer system, consisting of the invented material with preferably 1–45 oxide layers, can be employed as an antireflective filter. The oxides and coating depths of the system are thereby chosen by means of an algorithm, so that the reflection for a specific wavelength range will be particularly high. Appropriate algorithms can be taken from the pertinent literature (for example, Eisenhammer, T., M. Lazarov, N. Leutbächer, U. Schöffel and R. Sizmann. 1993. "Optimization of interference filters with genetic algorithms, applied to silver-based heat mirrors". *Applied Optics*. 32). Such a coating system, to which the invented material is applied, can have a reflection-reducing effect, while permitting better absorption of specific wavelengths. It is preferred that the sum of the products of the coating thickness of each antireflective layer, multiplied by the refractive index (measured in the visible wavelength range) of the employed material of the additional layer, be in the range from 20–80 nm, preferably from 80–110 nm.

As already mentioned, the incorporation of voids sets a balance between various competing properties, for example, the electrical and metallic ones. In addition to the optical properties, the electrical properties can also be correspondingly altered. A specific resistance of preferably 3,500 $\mu\Omega\times cm$ is brought about by a 20–25% (vol.-%) share of voids in the material. Only the control of voids permits the controlled variation of specific resistance and explains the influence of the plasma frequencies upon the optical properties. Only this permits controlled designing of the properties of this material important for certain applications, for example, as selective absorbers.

The invented materials with adjustable properties, which are also both electrically and temperature resistant, are useful in various branches of industry:

In solar energy: If the invented material, with a void portion of preferably 22–26 vol.-%, is coated onto prefer-ably copper, molybdenum or aluminum by means of a coating process to a thickness of preferably 40–70 nm, a selective absorber results. The latter is able to convert incident solar radiation into heat with temperatures up to 400° C., without the need to concentrate the radiation. In addition, the material properties are adapted by controlling the chemical compositions and the portion of voids for optimal yields from the solar radiation as a function of the temperature desired for the heat energy, the weather and the concentration. For solar energy applications, the material is preferably applied as a thin layer to a metallic substrate (metal substrate) having any geometry, and the coating thickness is preferably chosen in the 40–80 nm range, so that the combination of thin layer and metallic substrate will absorb wavelengths as selective absorbers, concerting the incoming radiation from the sun into heat energy. Preferred thereby is the absorption of wavelengths in the 0.3 to 1.5 μm range. For the application in solar energy, the invented material has a void share in terms of volume of preferably 20–30%, a layer thickness of 40–70 nm, the metal substrate used being preferably copper or aluminum. In addition, an antireflective layer consisting of $SiO_2$ with a thickness of 70–120 nm, preferably from 85 to 100 nm, can be used. When used with solar energy, the radiation energy is absorbed in the material and the material thereby warmed, the heat energy being drawn off by a connection to a heat carrier. The heat carrier can thereby be one or more phases of water. The absorber can be built into any type of solar radiation collector.

In the semiconductor industry: It is known that silver and gold diffuse through thin layers consisting of TiN. These diffusion rates are small and poorly controllable. With the invented material the diffusion rate can be significantly increased and the electrical properties of the layer set within wide limits at the same time. In particular, the specific resistance can be made large (preferably 1,000–30,000 $\mu\Omega\times cm$). It is thus possible to produce circuit board traces of silver and gold by tempering.

As a coating for the vanes of a light mill: If a thin, heat-insulating slab, preferably of mica or an aerogel, is coated with copper, silver or aluminum of a thickness of approximately 200 to 1,000 nm and is then coated with the invented material with a preferred thickness of 40–150 nm to produce a selective radiation converter, this slab will then be very suitable for use as a vane in a light mill.

As a decorative layer: The invented material is suitable for use preferably as a decorative layer, if the material is applied in a thickness between 15 to 400 nm, preferably 30–150 nm, to a substrate, a visual impression of color will be produced by the interference effects of this combination. The material and the substrate can be thereby covered with a thin (approximately 60–120 nm), preferably partially transparent layer.

In powerplant technology: The invented material is suitable further suitable as a selective radiation emitter for the conversion of heat energy into electricity, the material being warmed and, as a selective radiation transmitter, liberating heat which is converted into current by means of a photocell. A coating of the invented material to a depth of 50–500 nm, preferably approximately 100–200 nm, on a substrate (preferably molybdenum), the material having a void content of 7–20% by volume, is preferred in the power industry as a selective emitter. Because the invented material is temperature-stable, the emitter can be heated to temperatures above 900° C.

In medicine: The interchange between dielectric and metallic properties is on a scale in the nm-range. It is known that metals, for example, silver, have an antimicrobial effect, though bacteria adhere to metals easily and form a film, they die there. New germs may also be present there, which are not killed, because they have no contact with the metal. Dielectric materials have germ-repellent properties. Because the invented material is in possession of both antimicrobial (metallic) as well as germ-repellent (dielectric) properties, bacteria are killed, but do not remain adherent. The antimicrobial effect remains intact.

This broad range of applications results from control of the physical properties via the voids. This control can be predicted simply by means of the effective media theory according to Bruggeman, which views the material as a mixture of voids and the participating phases. It is a significant advantage of the invention that the desired optical and electrical properties are not modulated by the chemical composition alone, but in addition by the voids. Important properties, such as adhesiveness, temperature stability, corrosion resistance, etc., are thereby able to remain intact, which are essentially determined by the chemistry.

Further advantages of the invention are that the metals of group IV B of the periodic system, nitrogen and oxygen, as well as the compounds produced from them, are not poisonous, and the compounds of titanium, zirconium or hafnium with nitrogen and oxygen are temperature-stable, resistant (hard) and light in comparison to metals like iron or copper.

BRIEF DESCRIPTION OF THE DRAWINGS

The invention is described with reference to FIGS. 1 through 9.

DETAILED DESCRIPTION OF THE INVENTION

Figure 1:
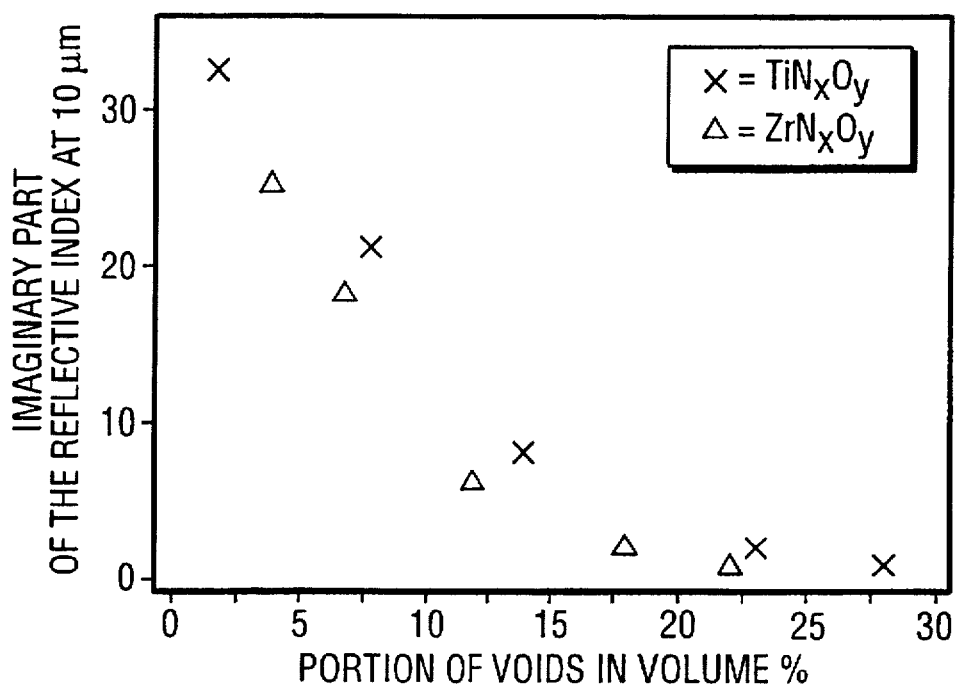
FIG. 1 shows the imaginary part of the refractive index at 10 µm as a function of the void percentage for $TiN_xO_y$ (crosses) and $ZrN_xO_y$ (triangles) (with x=0.7–0.9; y=0.3–0.6).

Furthermore, the goal of the present invention is achieved by a process for the reactive vacuum deposition or activated vacuum deposition. Per the invention, an oxide, nitride or carbide compound arises during deposition of the metal from group IV B of the periodic system onto a substrate by maintaining a gas atmosphere containing at least one of the gas types $N_2$, $O_2$, $CH_4$ and/or noble gases. The condensation of the metal particles on a heatable substrate is thereby controlled by means the gas pressure $p_{tot}$, the evaporation rate r, the substrate temperature $T_{sub}$, and by the distance 1 between metal source and substrate in such a way that the volume share of voids amounts to from 2 to 45% by volume, their magnitude lying in the range from $(0.5 \text{ nm})^3$ to $(100 \text{ nm})^3$. The production parameters are chosen as follows:

T=20° to 400° C., l=0.01 to 1.5 m the partial pressure ratio of the gases $N_2$ and $O_2$: $(p_{N2}/p_{O2})$=1 to 2,000, $p_{tot}$=2×10$^{-5}$ hPa–4×10$^{-2}$ hPa and r=0.01 to 60 nanometers/s.

In the case of the production parameters it is necessary, to set them in such a way that the void content can be predicted. This can be accomplished by means of the following process: for substrate temperatures in the range of preferably from 100° to 220° C. and a distance 1 between the evaporator source and the substrate in the range of preferably from 0.5 to 1.2 m, the following holds true:

A volume percentage of 34% of voids is achieved, if $$K = p_{tot} \cdot r/l = (1 \text{ to } 3) \cdot 10^{-4} \frac{\text{mBar nm}}{\text{sm}},$$

and the total gas pressure $p_{tot}$ lies in the range of from $2 \times 10^{-3}$ to $2 \times 10^{-2}$ hPa.

A volume share of 20% of voids is achieved, if the choice is made in the $$K = p_{tot} \cdot r/l = (0.2 \text{ to } 0.5) \cdot 10^{-4} \frac{\text{mBar nm}}{\text{sm}}$$

range. Volume percentages between 20 and 34% can be specified by selection of the magnitude K according to the following equation:

$$K = ((0.4 \text{ to } 0.2) \cdot \text{desired void percentage} - 0.7) \cdot 10^{-4} \frac{\text{mBar nm}}{\text{sm}}$$

There is thus the possibility of achieving the desired portion of voids in the invented material both with the rate r, with the total pressure $p_{tot}$ and with the distance 1.

Analogously, it is possible to control the volume percentage of voids in the layer for substrate temperatures in the range of preferably from 250° to 400° C. and distance 1 in the range of preferably from 0.5 to 1.2 m in the following manner:

A volume share of, for example, 40% voids is achieved if $$K = (6 \text{ to } 8) \cdot 10^{-4} \frac{\text{mBar nm}}{\text{sm}}$$

and $p_{tot}$ lies in the range of $2 \times 10^{-2}$ hPa to $4 \times 10^{-2}$ hPa. If K is chosen in the range of $$K = (0.8 \text{ to } 1.9) \cdot 10^{-4} \frac{\text{mBar nm}}{\text{sm}},$$

the volume percentage of voids is 20%. To achieve values between 20 and 40%, K must be chosen according to the equation:

$$K = ((0.12 \text{ to } 0.31) \cdot \text{desired void percentage} - 0.7) \cdot 10^{-4} \frac{\text{mBar nm}}{\text{sm}}.$$

Volume percentages lying in between can of course be determined by linear interpolation. Small volume shares of voids (2–20%) are achieved at small rates 0.01–0.1 nm/s and low gas pressures of $10^{-4}$ mBar. Very large void percentages (>40%) are produced at high total gas pressures >4×10$^{-2}$ mBar. At these gas pressures, the material can be present as a loose bond. Per the invention, the coating is applied to a substrate preferably of molybdenum, silver, gold, copper, aluminum, tungsten, nickel, zirconium, hafnium, tantalum, niobium, vanadium, iron or alloys of the same. To produce the material as a block, without a substrate, the following two methods are suitable:

The (PVD) deposition takes place on NaCl, KBr or on other salts in any thickness. The salt is then dissolved in water, and invented material remains behind.

The deposition is effected onto thin metal with a low melting point, such as copper, aluminum, tin, zinc or brass. The material and the substrate (base) are then heated under high vacuum ($10^{-10}$), and of course at temperatures near the melting point of the metal, so that the metallic substrate evaporates. Remaining behind is the invented material.

The coating thickness is optional, preferably from 30 to 120 nm. By preference, the gas atmosphere can also contain $H_2O$ and volatile compounds of carbon. The production process can thereby be arranged more cheaply. It is conceivable in many cases to replace oxygen entirely with water, or to admit air.

Moreover, the goal of the present invention is achieved by a device for the vacuum deposition of thin layers of the invented material. In that case, in a vacuum deposition chamber, a metal from group IV B of the periodic system is deposited by means of evaporation on a substrate located in the apparatus from 0.01 to 1.5 m from the evaporation crucible. A gas atmosphere is maintained via one or more gas metering valves or gas flow meters and measurement as well as regulation of the partial pressures with a mass spectrometer. The gas atmosphere contains at least one of the gas types $N_2$, $O_2$, $CH_4$ and noble gases. The substrate temperature is regulated in the 20°–400° C. range via a regulator, preferably a PiD regulator. The evaporation rate is measured with a quartz oscillator and its signal controls the output of the evaporator by means of a regulator, preferably a PiD regulator. The evaporation desired is set. The coating parameters indicated above are achieved with the device. In addition, the total gas pressure is determined with a total gas pressure meter. Utilized for evaporation is an electron-beam evaporator and/or a resistance evaporator and/or an inductive evaporator. The invented device becomes less expensive when a resistance or inductive evaporator is used. The substrate is heated to the necessary substrate temperature from 20° to 400° C. preferably by means of radiation heating and regulated. Also suitable is inductive heating or electrical resistance heating.

The evaporation of the metal takes place preferably in a separate evacuatable chamber, and this chamber is connected by means of a shutter with a chamber containing the gas atmosphere and the substrate. This execution variant permit a higher overall pressure, without reducing the working life of the evaporator.

The gas atmosphere mixture is preferably controlled via separate gas flow meters or by means of a mass spectrometer. Suitable for measuring the size of $p_{tot}$ is, for example, a friction manometer or a baratron. Gradient layers are also produced by the invented device. In these layers, the composition changes with the coating depth. This can be controlled with the composition of the gases introduced. An increase of $N_2$ produces coatings containing more nitrogen. The gas composition can be regulated via the inflow or the measurement of the partial pressures. If the friction manometer is employed, it is possible to deliver reproducible coating properties with the invented device.

If the substrate is a strip or a foil formed according to the $\cos^n$-characteristic of the evaporator (with n=1 to 7) of the evaporator, so that it is adapted to the evaporator characteristic of the evaporator, a uniform coating over the entire surface is assured.

By preference, the coating chamber is connected to one or more further coating chambers by a separately evacuatable vacuum line, the substrate being passed from one chamber to another without breaking the vacuum and submitted to a separate coating process. Multilayer systems are the result.

EXAMPLE 1

In a high vacuum installation, titanium and zirconium are evaporated by means of an electron-beam evaporator in gas mixture of nitrogen and oxygen. The nitrogen partial pressure was 2.5 to $9.5 \times 10^{-4}$ mBar, and the oxygen partial pressure was varied in the range from $1 \times 10^{-8}$ mBar to $8 \times 10^{-5}$ mBar. Coated were 2 mm thick copper disks and 1 mm thick glass disks. This substrate was held at 170° C. during the process. A plasma discharge was ignited in the recipients by means of a surface electrode. This increases the readiness for the formation of TiN and TiO, or ZrN and ZrO, in the layer. Produced for purposes of analysis were samples of various layer thicknesses (30 to 120 nanometers) and void percentages (5–32% by volume). The partial pressure ratio of $N_2$ to $O_2$ was thereby held at 35, and the distance of the substrate from the evaporator was 0.8 m. The void percentage is controlled by means of the evaporation rate, which assumed the following values: 0.06 nm/s for small void percentages and up to 0.2 nm/s for high percentages of voids.

The crystalline phases TiN and TiO, or ZrN and ZrO, are identified by means of X-ray reflectometry. The element composition was measured via elastic record detection (ERD). Layer thickness and layer density were determined by means of grazing incidence X-ray reflectometry (GIXR). The portion of voids and their size distribution was determined by measurement of the scattered X-ray radiation with grazing incidence.

It was apparent that the mass density of the layer relative to the TiO or TiN mass was reduced by the percentage filled with voids. For zirconium, there were deviations of from 3 to 5% from this rule. The degree of solar absorption $\alpha_{sol}$ was determined from measurements of the degree of aimed hemispherical reflection $\rho(\lambda)$ according to $$\alpha_{sol} = \frac{\int_0^\infty AM15(\lambda)(1 - \rho(\lambda))d\lambda}{\int_0^\infty AM15(\lambda)d\lambda}.$$

Here AM 15 ($\lambda$) is the standard solar spectrum AM 1.5 and lambda the wavelength of the radiation. The degree of thermal emission was measured calorimetrically at temperatures from 150° to 400° C.

The optical constants were determined from reflection and transmission measurements with generally known graphical methods.

The results are presented in FIGS. 1 through 7. These are described here in detail.

FIG. 1 shows the imaginary part of the refractive index at 10 µm as a function of the portion of voids for $TiN_xO_y$ (crosses) and $ZrN_xO_y$ (triangles). The imaginary part without voids is high, a typical property of metals. A 20% to 25% portion of voids produces a mix-ture of metallic and dielectric behaviors. In both examples, it is apparent that a 20–30% portion of voids can produce a reduction of the imaginary part of the refractive index to moderate values. This means in the case of applications as a solar absorber that the degree of thermal emission can be kept low. The refractive index can be determined ellipsometrically or by measurement of the degrees of reflection and transmission. The percentage of voids and their size was determined by X-ray scatter or neutron scatter.

Figure 2:
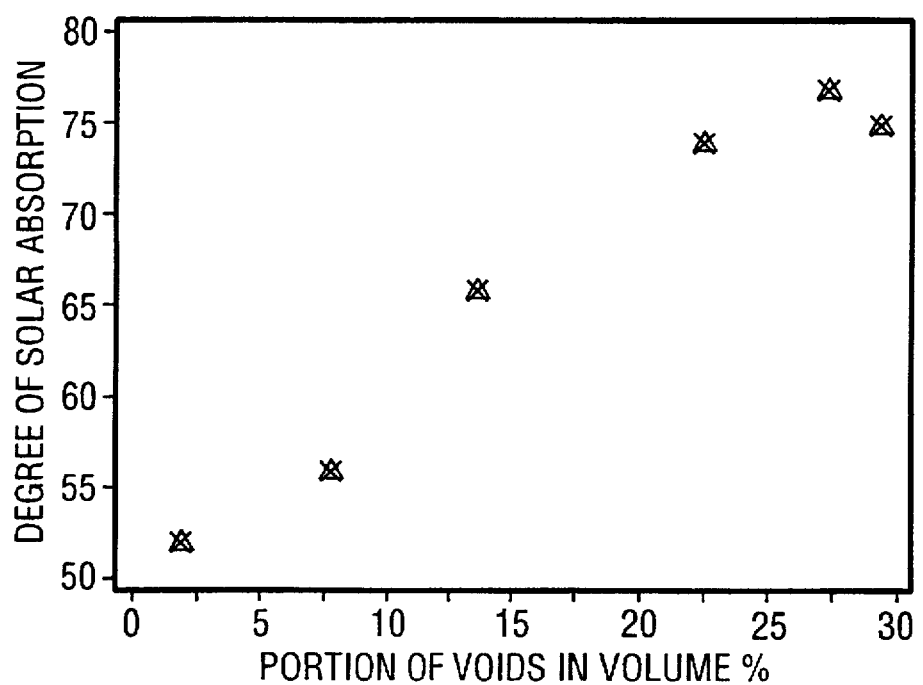
FIG. 2 shows the degree of solar absorption of a 55 nm thick $TiN_xO_y$-Cu absorber as a function of the void percentage (with x=0.7–0.9; y=0.3–0.6).

FIG. 2 shows the degree of absorption of a 55 nanometer thick $TiN_xO_y$-Cu absorber as a function of the percentage of voids. By measurement of the degree of reflection of the absorber and folding with the spectrum of the solar radiation incident to the earth, a determination was made of the share of absorbed energy, the degree of solar absorption. A maximal degree of absorption of the incident solar radiation results from a material whose void percentage amounts to 27.5%.

Figure 3:
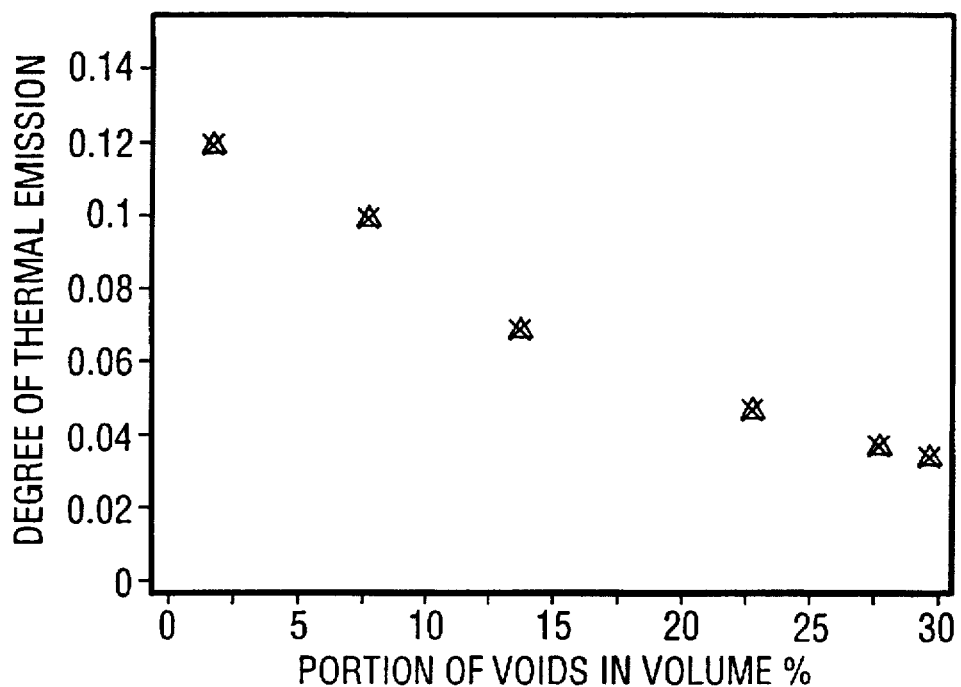
FIG. 3 shows the degree of thermal emission at 250° C. of a 55 nm thick $TiN_xO_y$ absorber as a function of the void percentage (with x=0.7–0.9; y=0.3–0.6).

FIG. 3 shows the degree of thermal emission at 250° C. of a 55 nanometer thick $TiN_xO_y$-Cu absorber as a function of the void share. The degree of thermal emission decreases with an increasing share of voids, which can be explained by the decrease in metallic properties. To measure the degree of thermal emission, the sample must be placed under a vacuum at the temperature of measurement, in this example, 250° C. It is achieved by means of a suitable structure that the sample loses heat only by means of radiation. The degree of emission is calculated from the energy balance.

Figure 4:
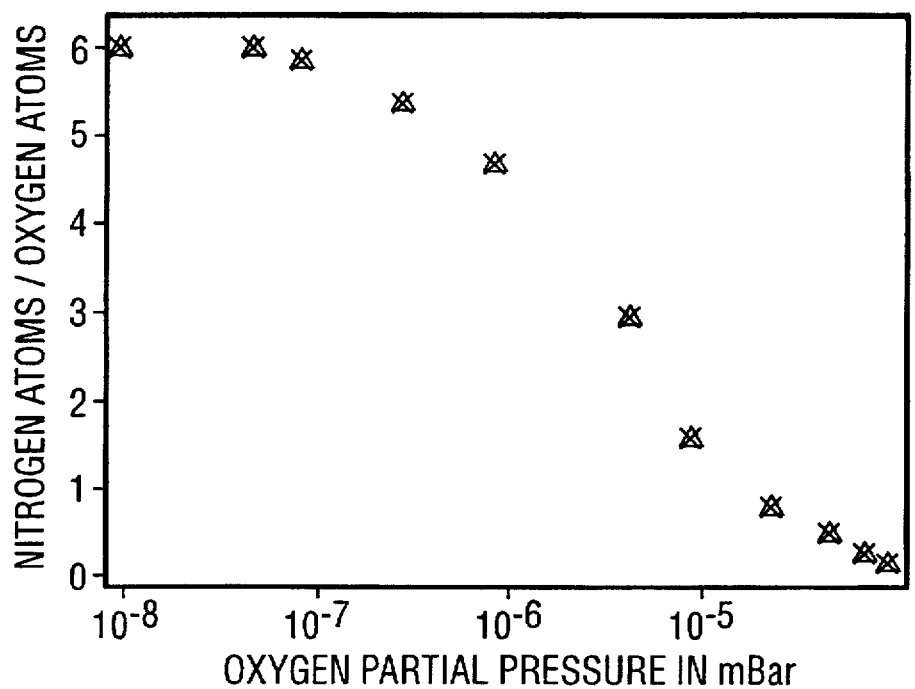
FIG. 4 shows the element composition relative to titanium relative to titanium as a function of the partial pres-sure of oxygen in the coating in the case of $TiN_xO_y$ (with x=0.7–0.9; y=0.3–0.6).

FIG. 4 shows the elemental composition relative to titanium as a function of the partial pressure of oxygen in the layer for $TiN_xO_y$. The nitrogen to oxygen ratio was kept in the invented device for producing the invented material with the range from 1 to 2,000. Thereby resulting from a low partial pressure of oxygen were the chemical properties needed for applications as a selective absorber of solar energy, for example, high adhesiveness.

Figure 5:
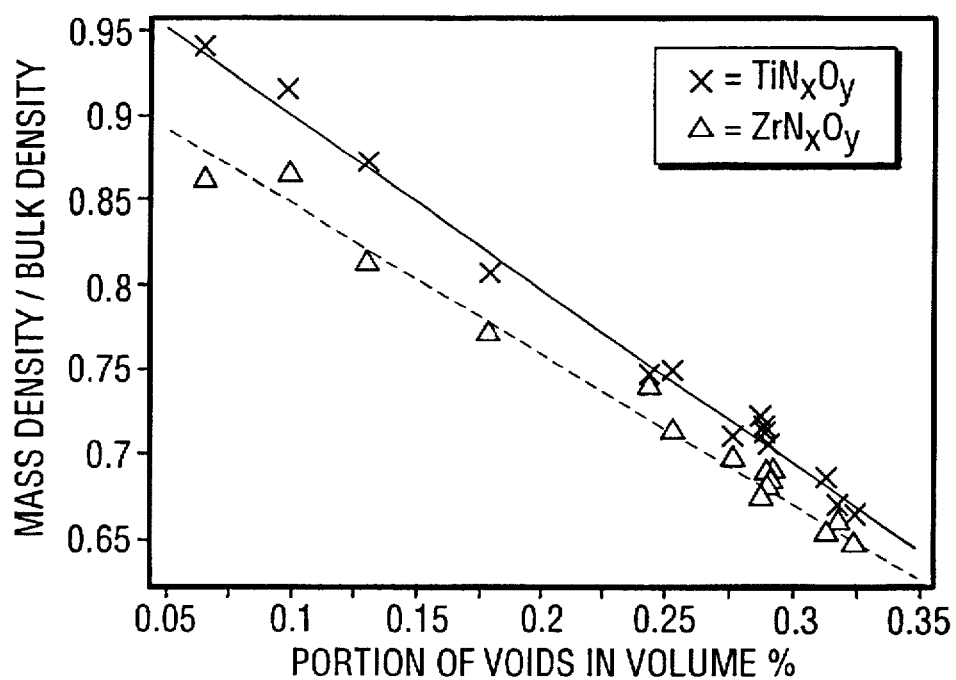
FIG. 5 shows the quotients of coating mass density to bulk density as a function of the void share in $TiN_xO_y$ (crosses) and $ZrN_xO_y$ (triangles) (with x=0.7–0.9; y=0.3–0.6).

FIG. 5 shows the quotient of the layer mass density to bulk density as a function of the void percentage in the case of $TiN_xO_y$ (crosses) and $ZrN_xY_y$ (triangles). It is evident that the mass density is governed by the void percentage.

Figure 6:
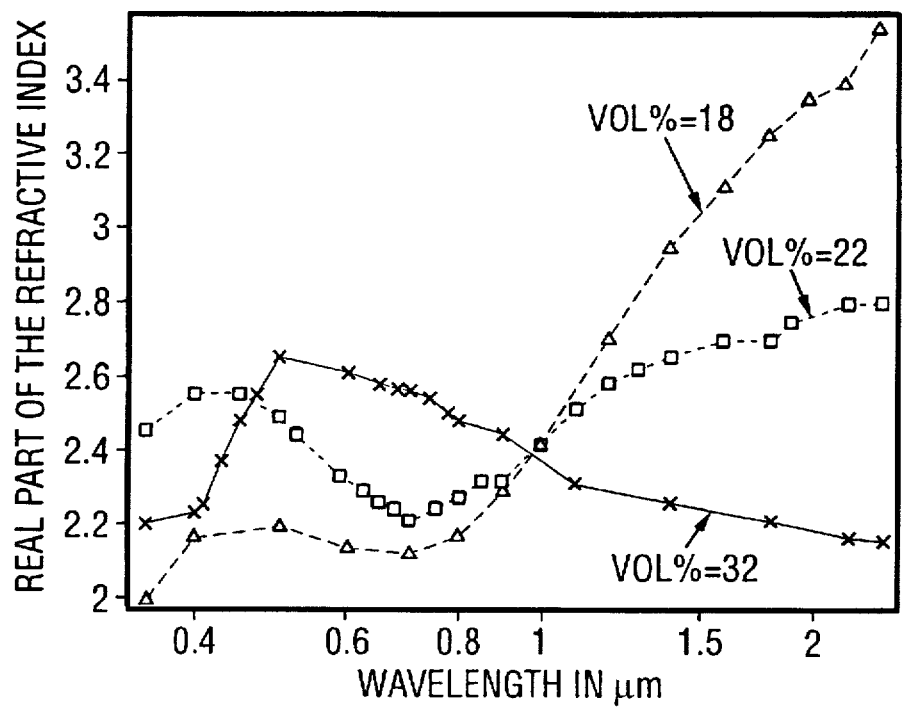
FIG. 6 shows the real portion of the refractive index as a function of the wavelength at various void percentages in $TiN_xO_y$ (with x=0.7–0.9; y=0.3–0.6).

FIG. 6 shows the real part of the refractive index as a function of the wavelength for various void percentages in the case of $TiN_xO_y$ coatings. With a void share of 18% by volume, the real part of the refractive index still shows metallic properties and rises with wavelength. With a 22% by volume share, neither metallic nor dielectric properties dominate, and at 32% by volume, the material is essentially dielectric.

Figure 7:
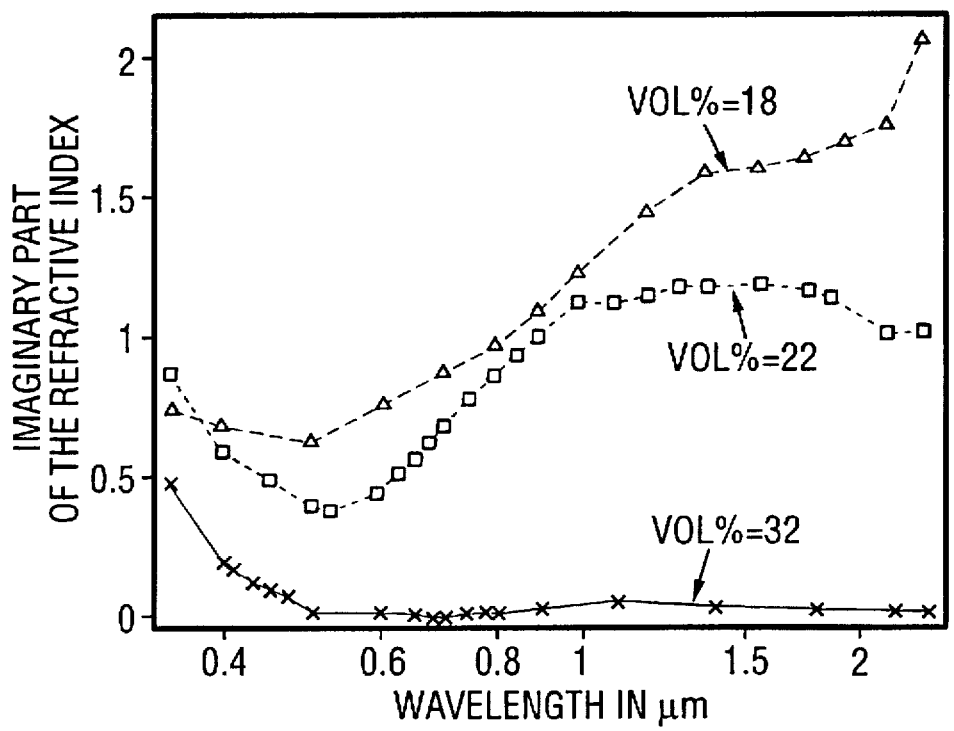
FIG. 7 shows the imaginary part of the refractive index as a function of the wavelength for various portions of voids in the case of $TiN_xO_y$ (with x=0.7–0.9; y=0.3–0.6).

FIG. 7 shows the imaginary part of the refractive index as a function of the wavelength for various void percentages in $TiN_xO_y$ coatings. With a void portion of 18% by volume, the imaginary part of the refractive index still shows metallic proper-ties and rises with wavelength. With a 22% by volume share, neither metallic nor dielectric properties dominate, and at 32% by volume the material is dielectric within broad wavelength ranges.

Figure 8:
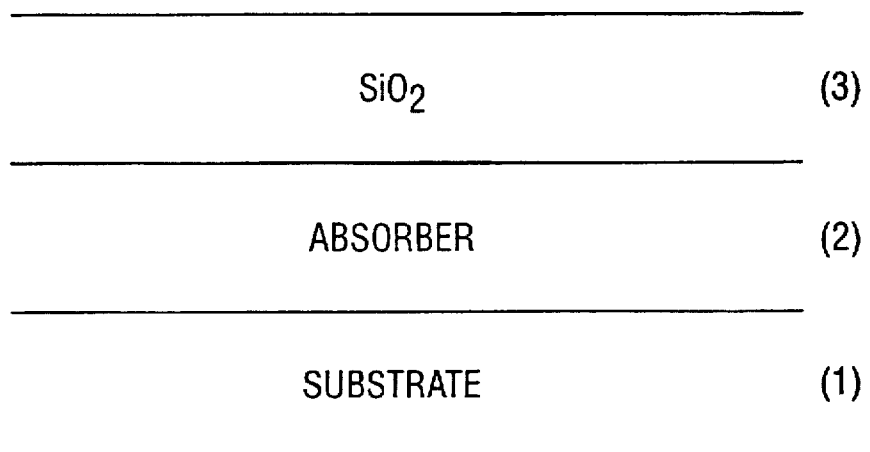
FIG. 8 shows a section through a selective solar absorber in which the invented material is used.

FIG. 8: An application of the invented material is shown in Fi. 8. Presented in FIG. 8 is a section through a selective solar absorber, in which the invented material (2) is used. On a highly reflective substrate (1), copper, a 55 nanometer thick coating of the invented material (2) is applied, and the latter is covered in turn with a 92 nanometer thick antireflective layer consisting of $SiO_2$ (3). The antireflective layer increases the degree of solar absorption from 0.8 to 0.94.

The invented material (2) is one characterized by a void content of 27.5% by volume and a titanium:oxygen:nitrogen ratio of 1:0.92:0.35.

Figure 9:
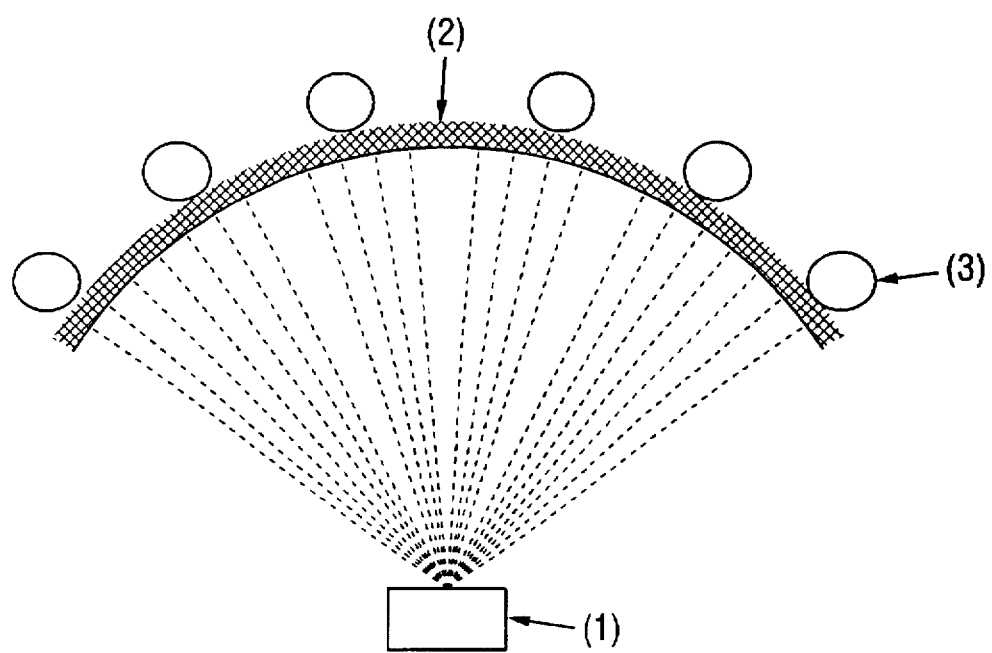
FIG. 9 shows a section through the device for producing the invented material.

FIG. 9 shows a section through the invented production apparatus. A copper strip (2) is passed over an electron beam evaporator (1). This is kept in a curved shape by rollers (3) in such a way that the coating is uniform. The curve follows the characteristic of the evaporator which can differ from that of a Lambert radiator. Whereas the characteristic of a Lambert radiator can be described by the "cosine[1] law", a modification of the law must be considered in the case of an electron beam evaporator, that is to say, a "cosine"" characteristic is followed with n in the range of from 1 to 7.

We claim:

1. A process for the production of thin layers of a composition of a metal M from Group IV B of the periodic system, nitrogen and oxygen, having a formula of $MN_xO_y$ wherein $x$ and $y$ each ranges from about 0.1 to about 1.7, by means of reactive vacuum deposition or activated reactive vacuum deposition, wherein, during the deposition of the metal from Group IV B of the periodic system, maintaining a gas atmosphere comprising $N_2$ and $O_2$ gas, and controlling deposition of evaporated metal particles onto a heatable substrate via total gas pressure $p_{tot}$, evaporation rate r, substrate temperature $T_{sub}$ and distance 1 between a metal evaporation source and a substrate, in which case these parameters lie in the ranges $T_{sub}$=20° to 400° C., l=0.01 to 1.5 m, the partial pressure ratio of the gases $N_2$ and $O_2$: $(p_{N2}/p_{O2})$=1 to 2,000, $p_{tot}$=2×10$^{-5}$ hPa–4×10$^{-2}$ hPa, r=0.01 to 60 nm/s, so that layers with a volume share of voids of from 2 to 45% arises, whose size lies in the range from $(0.5 \text{ nm})^3$ to $(100 \text{ nm})^3$.

2. Process according to claim 1, wherein the layer is applied to a metallic substrate selected from the group consisting of molybdenum, silver, gold, copper, aluminum, tungsten, nickel, chromium, zirconium, titanium, hafnium, tantalum, niobium, vanadium, iron and their alloys.

3. Process according to claim 1, wherein the layer thickness is from 30 to 120 nm.

4. Process according to claim 2, wherein the layer thickness is from 30 to 120 nm.

5. Process according to claim 1, wherein the gas atmosphere comprises $H_2O$ and volatile compounds of carbon.

6. Process according to claim 2, wherein the gas atmosphere comprises $H_2O$ and volatile compounds of carbon.

7. A process according to claim 1, wherein the gas atmosphere further comprises at least one gas selected from the group consisting of $CH_4$ and noble gases.

8. A process for the production of thin layers on a substrate of material comprising chemical compounds of one or more metals (M) of group IV B of the periodic system, nitrogen (N) and oxygen (O), said process comprising:

depositing metal from Group IV B of the periodic system;
maintaining a gas atmosphere during said depositing wherein the atmosphere comprises at least one gas selected from the group consisting of $N_2$, $O_2$, $CH_4$, and noble gases, controlling the total gas pressure $p_{tot}$ between about $2 \times 10^{-5}$ h Pa and about $4 \times 10^{-2}$ h Pa, controlling the evaporation rate r between about 0.01 and about 60 nm/s, controlling the substrate temperature $T_{sub}$ between about 20° and about 400° C., controlling the distance l between a metal evaporation source and the substrate between about 0.01 and about 1.5 m, wherein the layers comprise a volume share of voids of from about 2 to about 45%, wherein the size of the voids range from about (0.5 nm)$^3$ to about (100 nm)$^3$.

9. A process according to claim 8, wherein said substrate comprises a material selected from the group consisting of molybdenum, silver, gold, copper, aluminum, tungsten, nickel, chromium, zirconium, titanium, hafnium, tantalum, niobium, vanadium, iron and alloys of these materials.

10. A process according to claim 8, wherein the thickness of said layer is from about 30 nm to about 120 nm.

11. A process according to claim 8, wherein the gas atmosphere in said maintaining step further comprises $H_2O$ and volatile compounds of carbon.

12. A process according to claim 8, wherein said depositing comprises reactive vacuum deposition.

13. A process according to claim 8, wherein said depositing comprises activated reactive vacuum deposition.

14. A process as in claim 8, further comprising coating the layers with at least one additional layer of oxide.

15. A process as in claim 14, wherein the additional layer of said coating the layers comprises an oxide selected from the group consisting of $SiO_2$, $ZrO_2$, $HfO_2$, $Al_2O_3$, and $Y_2O_3$.

* * * * *

UNITED STATES PATENT AND TRADEMARK OFFICE
CERTIFICATE OF CORRECTION

PATENT NO : 5,776,556
DATED : July 7, 1998
INVENTOR(S): Miladin P. Lazarov et al.

It is certified that error appears in the above-identified patent and that said Letters Patent is hereby corrected as shown below:

In column 4, line 9, replace "are distinguished by the" with --have a very small--.

Signed and Sealed this

Twenty-seventh Day of June, 2000

Attest:

Q. TODD DICKINSON

Attesting Officer

Director of Patents and Trademarks